US007009340B2

(12) United States Patent
Asai et al.

(10) Patent No.: US 7,009,340 B2
(45) Date of Patent: Mar. 7, 2006

(54) DISPLAY UNIT AND ITS MANUFACTURING METHOD

(75) Inventors: Nobutoshi Asai, Kanagawa (JP); Tetsuo Urabe, Kanagawa (JP); Yuichi Iwase, Kanagawa (JP)

(73) Assignee: Sony Corporation, Tokyo (JP)

( * ) Notice: Subject to any disclaimer, the term of this patent is extended or adjusted under 35 U.S.C. 154(b) by 188 days.

(21) Appl. No.: 10/691,406

(22) Filed: Oct. 22, 2003

(65) Prior Publication Data

US 2004/0150329 A1    Aug. 5, 2004

(30) Foreign Application Priority Data

Oct. 24, 2002  (JP) .......................... P2002-309931

(51) Int. Cl.
*H01J 1/62*  (2006.01)
(52) U.S. Cl. ............... 313/512; 313/506; 313/501; 362/551
(58) Field of Classification Search ........... 313/506, 313/512, 504, 501; 445/24, 25; 362/555, 362/551, 230, 231, 235, 240, 244, 800, 330, 362/339, 31; 359/599
See application file for complete search history.

(56) References Cited

U.S. PATENT DOCUMENTS

| 5,315,491 | A | * | 5/1994 | Spencer et al. ............. 362/84 |
| 6,331,915 | B1 |  | 12/2001 | Myers |
| 6,787,976 | B1 | * | 9/2004 | Minoura et al. ............ 313/110 |
| 6,806,414 | B1 | * | 10/2004 | Shiotsuka et al. ......... 136/256 |
| 6,898,018 | B1 | * | 5/2005 | Minoura et al. ............ 359/627 |
| 2002/0057413 | A1 |  | 5/2002 | Sumida et al. |
| 2002/0063517 | A1 | * | 5/2002 | Hosokawa .................. 313/504 |
| 2002/0084952 | A1 |  | 7/2002 | Morley et al. |
| 2002/0105267 | A1 | * | 8/2002 | Mochizuki et al. ......... 313/512 |

FOREIGN PATENT DOCUMENTS

| JP | 10-172756 | 12/1996 |
| JP | 09-326297 | 12/1997 |
| JP | 11-329742 | 11/1999 |
| WO | WO 02/37580 A1 | 5/2002 |

* cited by examiner

*Primary Examiner*—Edward J. Glick
*Assistant Examiner*—Elizabeth Keaney
(74) *Attorney, Agent, or Firm*—Sonnenschein, Nath & Rosenthal LLP

(57) ABSTRACT

The invention provides a display unit which can improve emission efficiency of lights for image display, and assure luminance of display images. The display unit comprises micro prisms which are arranged in the positions corresponding to organic EL devices, and which have a high refraction index to refract a light, and auxiliary prisms with a low refraction index which are embedded in voids between each micro prism. A light volume of the light viewed as an image in the direction facing an organic EL display (facing direction) is a total of a light volume of a light essentially emitted from the organic EL device in the facing direction, and lights which are directed in the facing direction by utilizing refraction phenomenon based on differences of refraction index between the micro prism and the auxiliary prism. Compared to the case wherein the micro prisms and the auxiliary prisms are not provided, an emission volume of the light in the facing direction is increased by the light volumes of the lights.

9 Claims, 13 Drawing Sheets

DISPLAY UNIT AND ITS MANUFACTURING METHOD

BACKGROUND OF THE INVENTION

1. Field of the Invention

The present invention relates to a display unit such as an organic EL display and its manufacturing method.

2. Description of the Related Art

In late years, displays having various display mechanisms have been known. Specially, a full-color organic EL display which utilizes organic light emitting (organic EL (electroluminescence)) phenomenon is noted in point of its wide visual field angle, its low driving voltage, and its high luminance. Based on these advantages, lately, trials to mount the organic EL display on compact information terminal devices for personal use typified by a mobile phone and a PDA (personal digital assistant) have been made.

In the development field of the organic EL display, in order to assure luminance of display images, technological establishment to enable improvement of emission efficiency (extraction efficiency) of lights for image display has been desired. In particular, regarding the organic EL display mounted on the compact information terminal devices for personal use, improvement of emission efficiency in the direction facing the organic EL display (hereinafter simply referred to as "facing direction") is expected. In order to realize this request, many proposals have been already made.

As a method to improve emission efficiency, for example, a method in which a micro lens or a micro prism as an optical component for light focusing which utilizes light refraction phenomenon is introduced to the organic EL display, in order to focus the lights for image display generated in a light emitting source (organic EL device) in the facing direction can be cited.

As a concrete organic EL display using the micro lens, for example, a structure wherein an aggregation of small micro lenses (micro lens array) is arranged on point light emitting organic EL devices which are pattern-arranged has been proposed (for example, refer to Japanese Patent Application No. H09-171892 (Ps. 3–5, FIG. 3)). This micro lens array, for example, is formed by utilizing a molding technique which uses a metal mold corresponding to a form of the micro lens. However, in a conventional molding technique, a metal mold for molding is prepared separately, and a molding process using this metal mold is required. Therefore, a manufacturing process for the micro lens array becomes complicated, and its manufacturing cost becomes high. As a technique to form the micro lens array, in addition to the molding technique which uses a metal mold, for example, a technique wherein a lens material is cut and ground can be utilized. In this case, since a high processing technique is required in processing curved surface parts of the micro lens, manufacturing the micro lens array becomes difficult, and its manufacturing cost becomes high.

It is said that manufacturing a spherical micro lens is relatively easy. However, in the case of using this spherical micro lens, while lights generated in the central part of the organic EL device are appropriately refracted and emitted in the facing direction as desired, lights generated at ends of the organic EL device are in result largely refracted and emitted in the directions other than the facing direction, though desired not to be largely refracted and to be emitted in the facing direction. In addition, there have been restrictions in using the micro lens, for example, since sufficient refraction index cannot be obtained with the spherical micro lens, in order to assure refraction index, labor to make a low refraction index media (e.g. air) adjacent to the micro lens is required.

Meanwhile, as a concrete organic EL display using the micro prism, for example, a structure wherein an aggregation of small micro prisms whose size is extremely small compared to a light emitting area (micro prism array) is arranged on a whole face light emitting organic EL devices has been proposed (for example, refer to "Electrophospherescent Organic Light Emitting Devices" by S. R. Forrest et al., May 21–23 in 2002, Society for Information Display 2002 International Symposium (Boston, Mass., U.S.)). However, in the organic EL display mounting the whole face light emitting organic EL devices, though at the micro prism, many of the lights generated in the organic EL device is focused in the facing direction, some lights generated at the position corresponding to boundary parts between each micro prism are hard to be focused in the facing direction at the micro prism, so that loss of emission efficiency is caused. A technical example that the micro prism array is arranged on the whole face light emitting organic EL devices is also disclosed by, for example, Takahashi et al. (for example, refer to Japanese Unexamined Patent Application No. H09-73983 (P. 1, FIG. 1).

For the above reasons, in the conventional organic EL displays, it is difficult to say that emission efficiency is sufficient, in spite that the micro lens or the micro prism is used. In addition, in the case where the micro lens or the microprism is utilized in order to improve emission efficiency, there is a problem that difficulty in manufacturing is caused.

SUMMARY OF THE INVENTION

In light of the foregoing, it is a first object of the invention to provide a display unit which can improve emission efficiency of lights for image display, and assure luminance of display images.

It is a second object of the invention to provide a method of manufacturing a display unit which can improve emission efficiency and enable easy manufacture of the display unit.

A display unit according to the invention comprises: a plurality of light emitting devices which generate lights for image display; a plurality of first prisms which are arranged corresponding to each light emitting device, and refract the lights for image display; and second prisms which are at least embedded in voids formed between the first prisms, and which have a smaller refraction index than that of the first prisms.

A method of manufacturing the display unit according to the invention includes the steps of: forming a prism precursor layer to form the first prisms to cover a plurality of light emitting devices which are pattern-arranged on a support substrate; pattern-forming a plurality of second prisms on a transparent substrate; and forming the first prisms by placing the support substrate and the transparent substrate opposite so that the prism precursor layer and the second prisms are placed opposite to each other, and then pressure bonding the transparent substrate to the support substrate, and forming the prism precursor layer by utilizing a shape of the second prisms.

In the display unit according to the invention, the lights for image display generated in the plurality of light emitting devices are refracted in the first prisms, and then emitted to outside. Then, since refraction index in the second prisms is smaller than that in the first prisms, some of lights for image display refracted near the second prisms are not largely refracted in the second prisms, pass through the second prisms and are emitted to outside as other many lights. Consequently, the lights for image display are focused in the direction facing the display unit.

In the method of manufacturing the display unit according to the invention, the prism precursor layer as a prearrangement layer for the first prisms is formed to cover the plurality of light emitting devices which are pattern-arranged on the support substrate. Meanwhile, the plurality of second prisms are pattern-formed on the transparent substrate. The first prisms are formed by opposing the support substrate to the transparent substrate so that the prism precursor layer and the second prisms are placed opposite to each other, pressure bonding the transparent substrate to the support substrate, and forming the prism precursor layer by utilizing the shape of the second prisms.

Other and further objects, features and advantages of the invention will appear more fully from the following description.

DETAILED DESCRIPTION OF THE PREFERRED EMBODIMENT

An embodiment of the invention will be described in detail hereinbelow with reference to the drawings.

Figure 1:
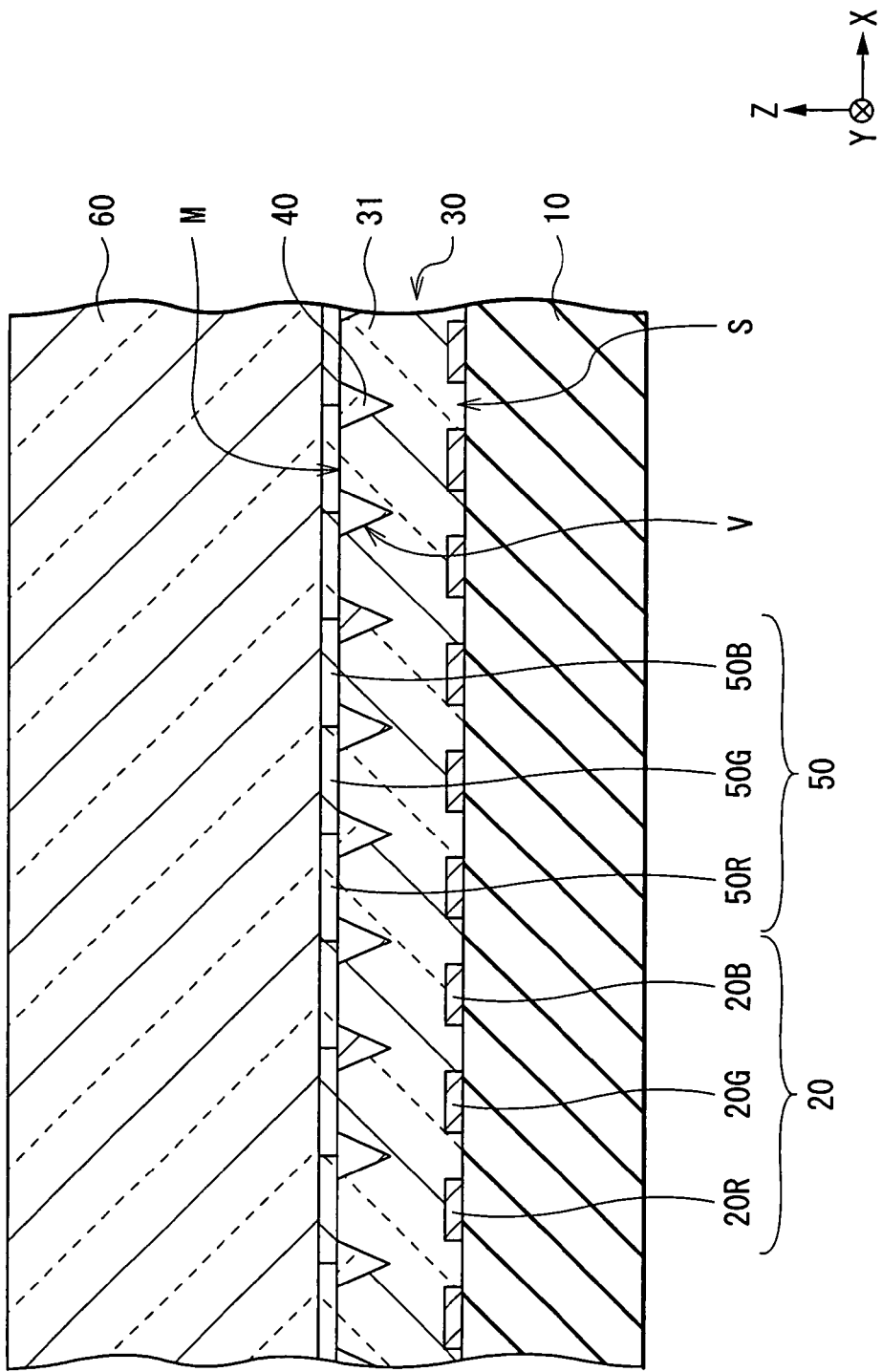
FIG. 1 is a cross sectional view showing an approximate cross sectional construction of an organic EL display according to an embodiment of the invention.
Figure 2:
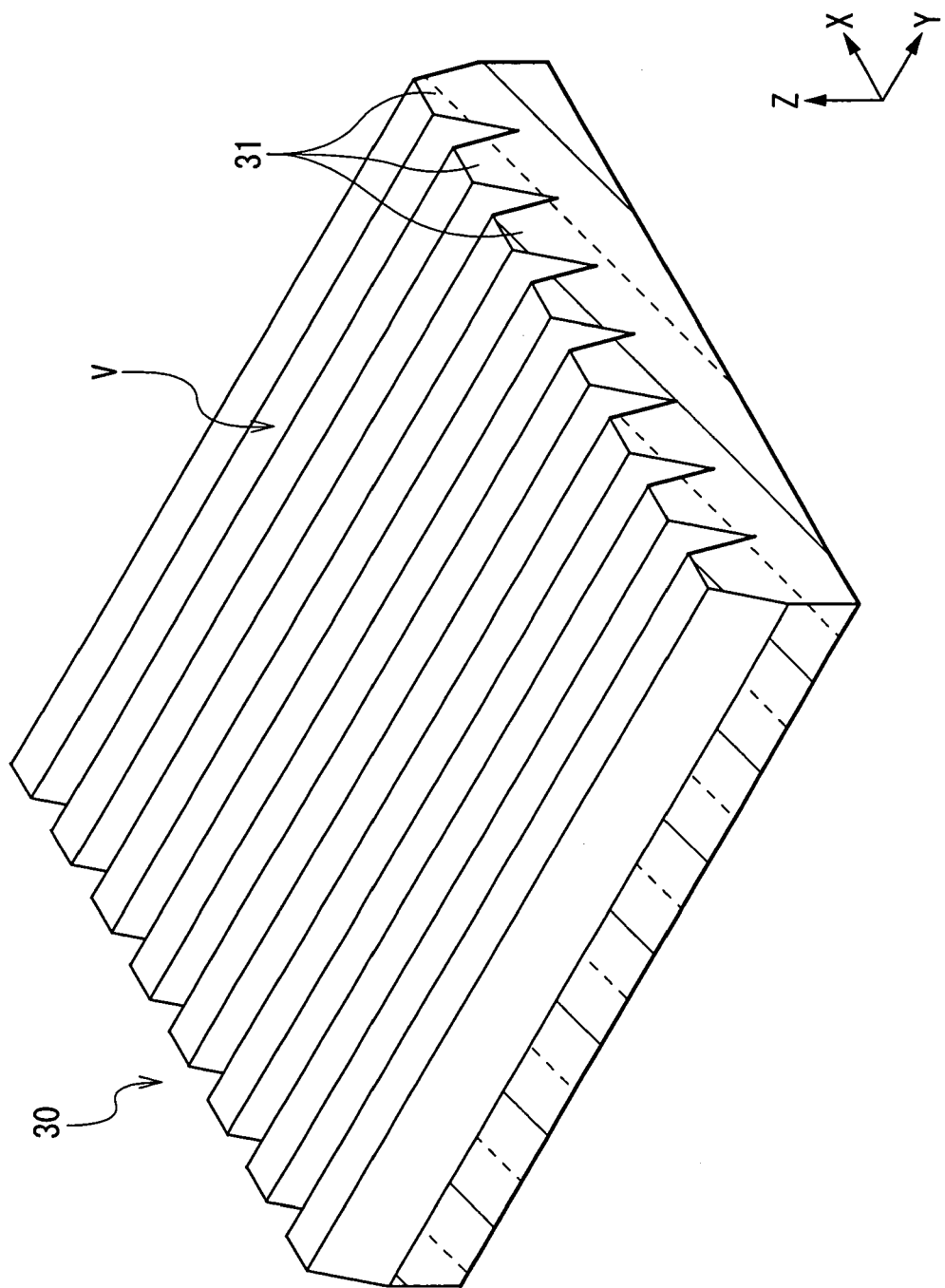
FIG. 2 is an oblique perspective figure showing an expanded oblique perspective construction of a substantial part (micro prism sheet) of the organic EL display illustrated in FIG. 1.

First, with reference to FIGS. 1 and 2, a construction of an organic EL display as a display unit according to the embodiment of the invention will be described. FIG. 1 shows an approximate cross sectional construction of the organic EL display, and FIG. 2 shows an expanded oblique perspective construction of a substantial part (micro prism sheet) of the organic EL display illustrated in FIG. 1

This organic EL display is a top emission display which displays images by utilizing organic EL phenomenon. As shown in FIG. 1, this organic EL display has a construction wherein a micro prism sheet 30, auxiliary prisms 40 (second prisms), color filters 50 (optical filters), and a cover plate 60 (transparent substrate) are layered in this order on organic EL devices 20 (light emitting devices) provided on a whole face of a driving substrate 10 (support substrate).

Main functions of the driving substrate 10 are to support the organic EL devices 20, and to make these organic EL devices 20 emit lights by applying voltage.

A function of the organic EL devices 20 is to emit lights by utilizing organic EL phenomenon, and generate lights for image display. These organic EL devices 20 include three elements which generate three colors lights corresponding to three primary colors in light, namely, plurality of organic EL devices 20R which generate red lights, organic EL devices 20G which generate green lights, and organic EL devices 20B which generate blue lights. Respective organic EL devices 20R, 20G, and 20B are pattern-arranged in the shape of matrix on the driving substrate 10. Detailed constructions of the organic EL devices 20R, 20G, and 20B will be described later (refer to FIG. 4).

A function of the micro prism sheet 30 is to refract the lights for image display. The micro prism sheet 30 is made of a material such as an epoxy resin, which has a larger refraction index of n1 (for example, n1=1.59) than that of the auxiliary prisms 40. As a resin making the micro prism sheet 30, from the view point of, for example, inhibiting moisture from leaking in places on the periphery of the organic EL devices 20, a material which has a water vapor permeability of about 50 g/m$^2$·24 hours (temperature=40° C., humidity=95%) or less is preferable. This micro prism sheet 30 includes a plurality of micro prisms 31 (first prisms) arranged corresponding to respective organic EL devices 20R, 20G, and 20B as parts which refract the lights for image display. Each micro prism 31 has a continuous structure wherein respective micro prisms 31 are connected to each other in the direction of X-axis. Surface of the micro prism 31 may be provided with, for example, AR (anti reflection) coat treatment in order to prevent reflection of outside lights. As shown in FIG. 2, respective micro prisms 31 are, for example, pattern-arranged by sandwiching voids V whose cross sections along X-Z plane are in the shape of inverted triangles. Specifically, each micro prism 31 has a cross section in the shape of trapezoid along X-Z plane, and continuously extends in the direction of Y-axis while maintaining the trapezoidal cross section. As shown in FIG. 1, the voids V are provided corresponding to nonluminescent spaces S between respective organic EL devices 20R, 20G, and 20B. It is not indispensable that the plurality of micro prisms 31 should have a continuous structure in the direction of X-axis. A plurality of micro lenses 31 which are independent from each other can be arranged. A cross sectional shape of the void V is not limited to the inverted triangle, and, for example, an inverted trapezoid is possible. However, in the case where a cross section of the void V is set to the inverted trapezoid, a width of its basal plane is preferably narrowed as much as possible.

In particular, the micro prism sheet 30 not only has a function, for example as an optical component to refract the lights for image display, but also has a function as a sealing adhesive to bond the driving substrate 10 and the cover plate 60 together, and to seal the organic EL devices 20 between the driving substrate 10 and the cover plate 60. Detailed construction of the micro prism sheet 30 will be described later (refer to FIG. 3).

The auxiliary prisms 40 are embedded in the voids V to construct a flat face M along with the micro prisms 31 of the micro prism sheet 30. A main function of the auxiliary prisms 40 is to aid refraction of the lights for image display by the micro prisms 31, and to act as light paths for the lights for image display. These auxiliary prisms 40 are made of a material such as a fluorocarbon resin, which has a smaller refraction index of n2 (for example, n2=1.40) than that of the micro prism sheet 30. As a resin making the auxiliary prisms 40, for example, as the resin making the micro prism sheet 30, a material which has a water vapor permeability of about 50 g/m²·24 hours (temperature=40° C., humidity=95%) and less is preferable.

A function of the color filters 50 is to selectively transmit the lights for image display generated in the organic EL devices 20, and inhibit other lights from passing. The color filters 50 include three colors filters which are pattern-arranged corresponding to respective organic EL devices 20R, 20G, and 20B, namely a red color filter 50R, a green color filter 50G, and a blue color filter 50B.

The cover plate 60 is a transparent protective component to protect a lamination including the organic EL devices 20 and the micro prism sheet 30 from outside, and the cover plate 60 constructs emission paths in emitting the lights for image display to outside. The cover plate 60 is not necessarily required. For example, it is possible that the color filters 50 are exposed without providing the cover plate 60.

Figure 3:
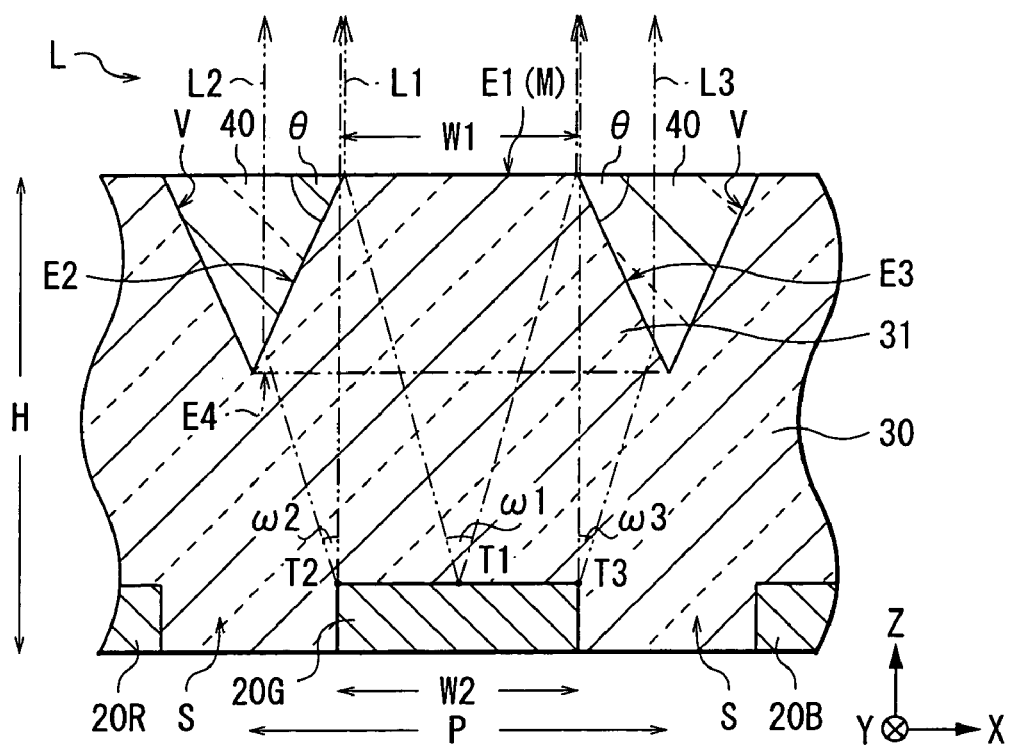
FIG. 3 is a cross sectional view showing a partly expanded cross sectional construction of a part on the periphery of a micro prism in the organic EL display illustrated in FIG. 1.

Next, with reference to FIG. 3, detailed construction of the micro prism sheet 30 will be described. FIG. 3 shows a partly expanded cross sectional construction of a part on the periphery of the micro prism 31 corresponding to the organic EL device 20G.

The micro prism 31 of the micro prism sheet 30 is, as described above, constructs part of the flat face M, and has a trapezoidal cross section wherein its upper base is an end face E1 located corresponding to the organic EL device 20G, its oblique lines are two oblique faces E2 and E3 respectively located corresponding to adjacent two nonluminescent spaces S, and its lower base is a virtual face E4 determined by these oblique faces E2 and E3. As dimensions of each part of the micro prism sheet 30, for example, when a width W2 of the organic EL device 20G is about 26 μm, a width W1 (=W2) of the end face E1 is about 26 μm, an angle of gradient θ made by the oblique faces E2 and E3 in relation to the flat face M is about 65°, a height H of the micro prism sheet 30 is about 105 μm, and an arrangement pitch P of the micro prism 31 is about 56 μm. Of these dimensions, the width W1, the angle of gradient θ, and the height H are important factors in relation to a visual field angle of the organic EL display.

Figure 4:
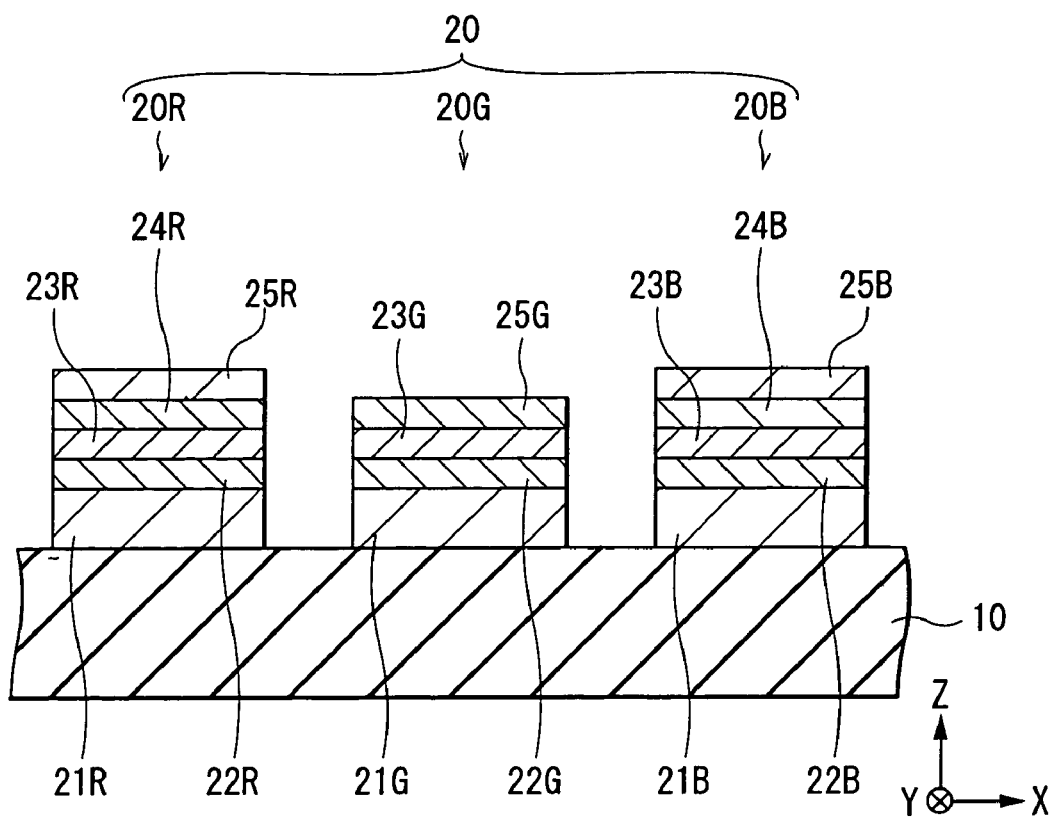
FIG. 4 is a cross sectional view showing an expanded cross sectional construction of organic EL devices.

Next, with reference to FIG. 4, detailed construction of the organic EL devices 20 will be described. FIG. 4 shows an expanded cross sectional construction of the organic EL devices 20R, 20G, and 20B. In FIG. 4, illustrations for components other than the driving substrate 10 and the organic EL devices 20R, 20G, and 20B are omitted.

The organic EL devices 20R, 20G, and 20B have an optical resonator structure which functions as a kind of narrow band filter utilizing light multiple interference phenomenon by, for example, making lights resonate between respective two electrode layers.

Namely, the organic EL device 20R has a structure, wherein, for example, an electron hole transport layer 22R, a light emitting layer 23R, an electron transport layer 24R, and an upper electrode layer 25R are layered on a lower electrode layer 21R in this order. The lower electrode layer 21R not only has a function as an original electrode, but also has a function as a reflection layer to reflect lights generated in the light emitting layer 23R. The lower electrode layer 21R is made of a metal material or an alloy material of platinum (Pt), gold (Au), chromium (Cr), tungsten (W) and the like. The electron hole transport layer 22R has a function to improve efficiency to inject electron holes into the light emitting layer 23R in addition to a function as an electron hole injection layer. The electron hole transport layer 22R is made of, for example, bis [(N-naphthyl)-N-phenyl] benzidine (α-NPD). The light emitting layer 23R has a function to generate red lights corresponding to current application, and made of, for example, 2,5-bis [4-[N-(4-methoxyphenyl)-N-phenylamino]] stilbenzene-1,4-dica-bonitrile (BSB). The electron transport layer 24R has a function to improve efficiency to inject electrons into the light emitting layer 23R, and made of, for example, 8-quinolinol aluminum complex ($Alq_3$). The upper electrode layer 25R is made of a metal material or an alloy material of aluminum (Al), magnesium (Mg), calcium (Ca), natrium (Na) and the like.

The organic EL device 20G has a structure, wherein, for example, an electron hole transport layer 22G, a light emitting layer 23G, and an upper electrode layer 25G are layered on a lower electrode layer 21G in this order. The lower electrode layer 21G and the upper electrode layer 25G have constructions, for example, similar to those of the lower electrode layer 21R and the upper electrode layer 25R in the organic EL device 20R. The electron hole transport layer 22G not only has a function to improve efficiency to inject electron holes into the light emitting layer 23G, but also has a function as an electron hole injection layer, and made of, for example, α-NPD. The light emitting layer 23G not only has a function to generate green lights corresponding to current application, but also has a function as an electron transport layer. The light emitting layer 23G is made of, for example, a mixture made by mixing coumarin 6 (C6) of about 1 vol % in $Alq_3$.

The organic EL device 20B has a structure, wherein, for example, an electron hole transport layer 22B, a light emitting layer 23B, an electron transport layer 24B, and an upper electrode layer 25B are layered on a lower electrode layer 21B in this order. The lower electrode layer 21B and the upper electrode layer 25B have constructions, for example, similar to those of the lower electrode layer 21R and the upper electrode layer 25R. The electron hole transport layer 22B not only has a function to improve efficiency to inject electron holes into the light emitting layer 23B, but also has a function as an electron hole injection layer, and made of, for example, α-NPD. The light emitting layer 23B has a function to generate blue lights corresponding to current application, and is made of, for example, 4,4-bis (2, 2-diphenyl-ethene-1-il) biphenyl (DPVBi). The electron transport layer 24B has a function to improve efficiency to inject electrons into the light emitting layer 23B, and made of, for example, $Alq_3$.

Next, actions regarding image display of the organic EL display will be described.

In this organic EL display, the lights for image display (hereinafter simply referred to as "lights") L are focused in the direction facing the organic EL display (hereinafter simply referred to as "facing direction"), by utilizing light refraction by the micro prisms 31.

Namely, as shown in FIG. 3, a light L1 generated at light emitting position T1 in the central part of the organic EL device 20G is emitted in the facing direction mainly by being refracted at the end face E1 of the micro prism 31. Meanwhile, a light L2 generated at light emitting position T2 at one end (left end) of the organic EL device 20G is emitted in the facing direction as the light L1 mainly by being refracted at the oblique face E2 by utilizing refraction index difference between the micro prism 31 with a high refraction index and the auxiliary prism 40 with a low refraction index, and passing through the auxiliary prism 40 without being further refracted, though under ordinary circumstances this light L2 is emitted in the direction deflected from the facing direction. A light L3 generated at light emitting position T3 at the other end (right end) of the organic EL device 20G is emitted in the facing direction as the lights L1 and L2 mainly by being refracted at the oblique face E3, and passing through the auxiliary prism 40 similar to the light L2 generated at the light emitting position T2. Consequently, even when the light L is generated at either the light emitting position T1, T2, or T3 on the organic EL device 20G, the light L is focused in the facing direction. Therefore, a light volume of the lights L in the facing direction is increased.

In this organic EL display, in addition to focusing the lights L by the micro prisms 31, the following actions can be obtained.

Namely, since the organic EL device 20G has the optical resonator structure, and reflectance near its light emitting wave length is lowered, color purity of the lights L1 to L3 is improved. In addition, as shown in FIG. 1, since based on the existence of the color filter 50G, selective permeability for the green lights can be obtained, leading to an extremely small transmittance for lights of colors other than green in the facing direction, contrast of display images is improved. In particularly, in the case where red lights generated in the organic EL device 20R and blue lights generated in the organic EL device 20B reach the color filter 50G, since a lot of red lights and blue lights are absorbed in the color filter 50G based on differences between the filter color and light emitting colors, a light volume of lights emitted in the directions other than the facing direction is decreased.

Figure 5:
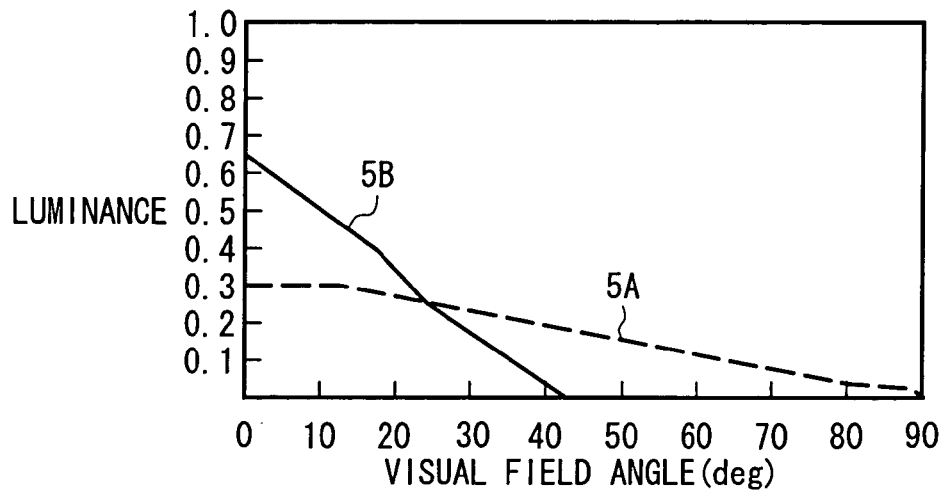
FIG. 5 is a diagram to explain characteristics of visual field angles of the organic EL display.
Figure 6:
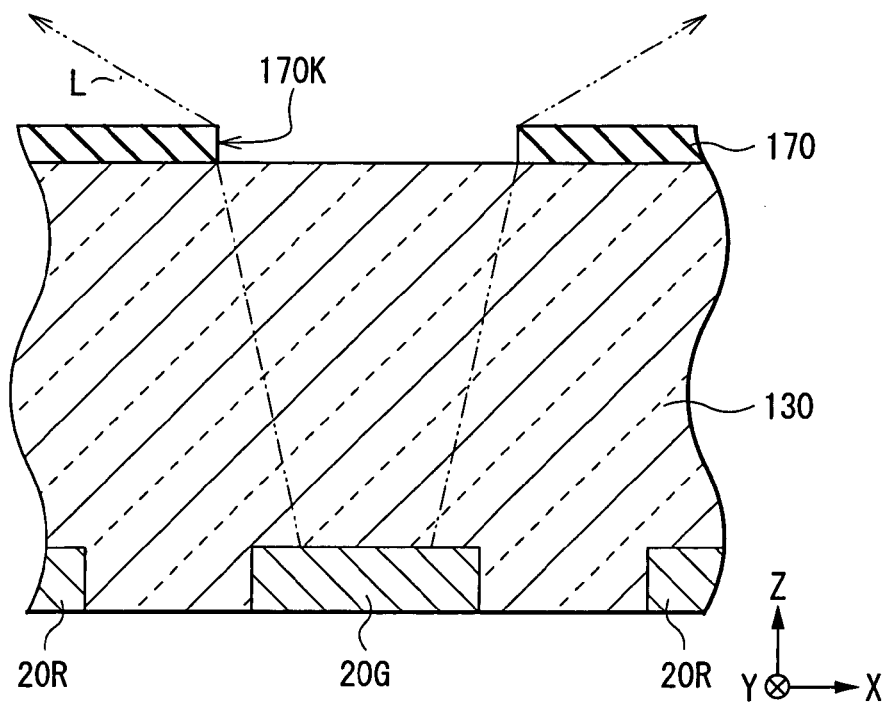
FIG. 6 is a cross sectional view showing an expanded cross sectional construction of an organic EL display as a comparative example to the organic EL display according to the embodiment of the invention.

Next, with reference to FIGS. 3, 5, and 6, characteristics of visual field angles of the organic EL display will be described. FIG. 5 is intended to explain the characteristics of visual field angles of the organic EL display (horizontal axis: visual field angle (deg), vertical axis: luminance). FIG. 6 shows an expanded cross sectional construction of an organic EL display as a comparative example in relation to the embodiment of the invention. In FIG. 5, "5A" represents the comparative example, and "5B" represents the embodiment of the invention, respectively. The visual field angle is a slope angle in the direction of X-axis in relation to the facing direction (perpendicular line of the display screen).

As shown in FIG. 6, the organic EL display of the comparative example has a construction similar to that of the organic EL display in this embodiment, except that the organic EL display of the comparative example comprises a transparent sheet 130 instead of the micro prism sheet 30 and the auxiliary prisms 40, and a black mask 170 having an opening 170K to narrow down a light path of the light L is layered on this transparent sheet 130.

After comparing characteristics of visual field angles of the organic EL displays according to this embodiment and the comparative example, the following results were obtained.

Namely, a luminance in the facing direction (visual field angle=0 deg) was about 0.3 in the comparative example (5A), and about 0.65 in this embodiment (5B). It was confirmed herefrom that in this embodiment, approximately twofold luminance can be obtained compared to the comparative example.

While in the comparative example (5A), broad luminance was obtained over a whole visual field angles (0 deg to 90 deg), in this embodiment (5B), luminance was only obtained in the visual field angles (0 deg to about 45 deg) in the facing direction and its vicinity, and luminance in the other visual field angles could not be obtained. It was confirmed herefrom that different from the comparative example, in this embodiment, it is possible to intentionally limit a visual field angle, i.e. a range wherein a display image can be viewed to the facing direction and its vicinity.

In the organic EL display according to this embodiment, the micro prisms 31 with high refraction index to refract the lights L, which are arranged in the positions corresponding to the organic EL devices 20R, 20G, and 20B, and the auxiliary prisms 40 with low refraction index, which are embedded in the voids V between each micro prism 31 are comprised. Therefore, as mentioned above as "actions regarding image display of the organic EL display," a light volume of the light L viewed as an image in the facing direction becomes a total of a light volume of the light L1 essentially emitted from the organic EL device 20G in the facing direction, and the lights L2 and L3, which are emitted from that organic EL device 20 in the directions other than the facing direction, and then are directed in the facing direction by utilizing refraction phenomenon based on differences of refraction index between the micro prism 31 and the auxiliary prism 40. Therefore, in this embodiment, as evidenced by the results shown in FIG. 5, compared to the case (comparative example) wherein the micro prisms 31 and the auxiliary prisms 40 are not provided, an emission volume of the lights L in the facing direction is improved by the light volumes of the lights L2 and L3, so that emission efficiency of the lights L is improved, and luminance of the display image can be assured.

Further, in this embodiment, since the lights L are focused in the facing direction based on the refraction of the micro prisms 31, an emission volume of the lights L emitted in the directions other than the facing direction decreases. Therefore, since light volume loss of the lights L required to display images becomes less, power consumption of the organic EL display can be lowered, along with assuring high image quality (luminance, color purity, and contrast). In addition, in this embodiment, based on realization of low power consumption, life of the organic EL display can be lengthened, and size and weight of its battery capacity can be reduced.

Further, in this embodiment, the color filters 50 (50R, 50G, and 50B) whose colors correspond to light emitting colors of the organic EL devices 20 (20R, 20G, and 20B) are provided. Therefore, when the selective light transmittance characteristic of the color filters 50, i.e. the selective absorption characteristic for the lights of the colors different from the filter color is utilized, it becomes possible that, as described above, while the light emission volume in the facing direction is assured in the X-axis direction, light emission volumes in the directions other than the facing direction are decreased. In this case, though in the facing direction, display images can be clearly viewed, in the directions other than the facing direction, display images become hard to be viewed since apparent luminance is lowered. Therefore, in this embodiment, as evidenced by the results shown in FIG. 5, it is possible to intentionally limit visual field angles in the direction of X-axis, and prohibit third persons from taking a look inside of the display images from the directions other than the facing direction.

In particular, in this embodiment, by varying the height H of the micro prism sheet 30 shown in FIG. 3, a visual field angle can be adjusted. Namely, when emission angles ω1 to ω3 of the lights L1 to L3 generated at each light emitting positions T1 to T3 of the organic EL device 20G are constant, mainly based on change of emission range of the lights L2 and L3, the smaller the height H is, the narrower an emission range of the whole lights L is, leading to a narrowed visual field angle. Meanwhile, the larger the height H is, the wider an emission range of the whole lights L is, leading to a widened visual field angle.

Further, in this embodiment, by varying an angle of gradient θ of the micro prism 31 shown in FIG. 3, a visual field angle can be adjusted. Namely, since the smaller the angle of gradient θ is, the wider an emission range of the lights L2 and L3 is, the visual field angle is widened. Meanwhile, since the larger the angle of gradient θ is, the narrower the emission range of the lights L2 and L3 is, the visual field angle is narrowed.

Further, in this embodiment, since the organic EL device 20 has the optical resonator structure, as described above, refraction index is selectively lowered near the light emitting wave length of the organic EL device 20. Therefore, since emission volumes of the lights of colors other than three primary colors in light are decreased, color purity of the lights L1 to L3 can be improved.

Further, in this embodiment, since the plurality of micro prisms 31 are arranged corresponding to the pattern-arranged plurality of organic EL devices 20, different from the case having the whole face light emitting organic EL devices, which is exemplified in the foregoing "Description of the Related Art," most of the lights L generated in an organic EL device 20 are refracted and focused in a corresponding micro prism 31. Therefore, in this embodiment, since loss of emission efficiency, which matters in the case having the whole face light emitting organic EL devices, is lowered, contribution to improvement of emission efficiency can be made also from this viewpoint.

In this embodiment, as shown in FIG. 3, the micro prism 31 is constructed so that the micro prism 31 has a trapezoidal cross section wherein the width W1 of the end face E1 is equal to the width W2 of the organic EL device 20G (W1=W2). However, a cross sectional shape of the micro prism 31 is not limited to the above, and modification of the cross sectional shape of the micro prism 31 can be made freely, as exemplified in FIGS. 7 to 10 below. Since in either construction exemplified below, as the case shown in FIG. 3, the lights L (L1 to L3) can be focused in the facing direction by utilizing the micro prism 31, the similar effect as in this embodiment can be obtained. The constructions listed below are similar to that in this embodiment except for feature parts of the constructions.

Figure 7:
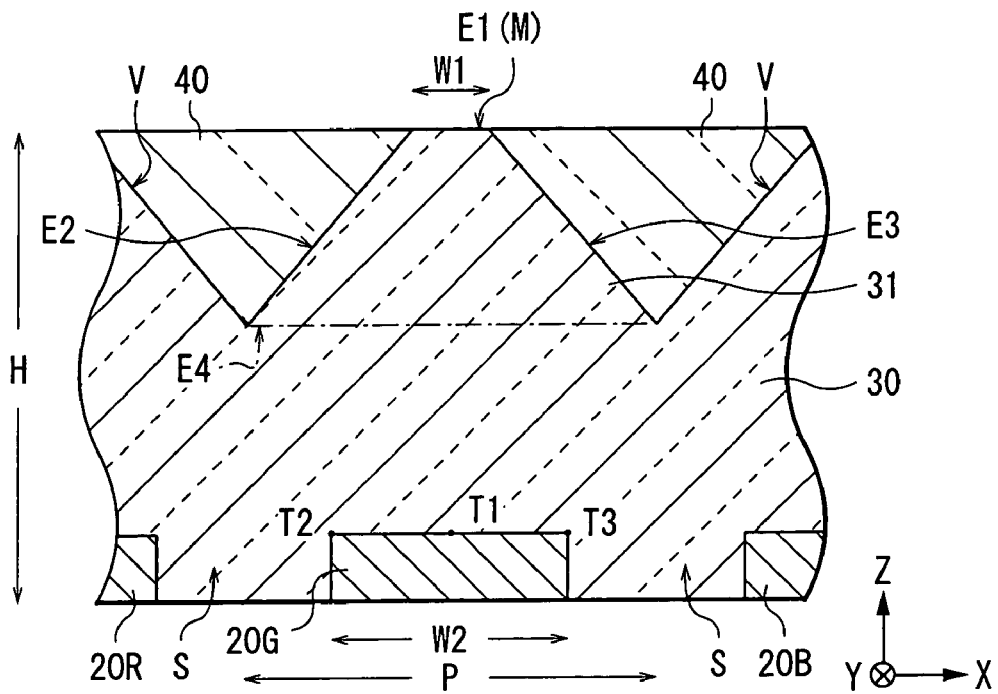
FIG. 7 is a cross sectional view showing a first modification regarding a construction of the micro prism.

Specifically, first, as shown in FIG. 7, it is possible to construct the micro prism 31, so that the micro prism 31 has a trapezoidal cross section wherein a width W1 of the end face E1 is smaller than a width W2 of the organic EL device 20G (W1<W2). In this case, particularly, since an emission range of the light L1 generated at the light emitting position T1 is widened, luminance over the whole facing direction can be uniformised, though luminance in the central part in the facing direction is slightly lowered.

Figure 8:
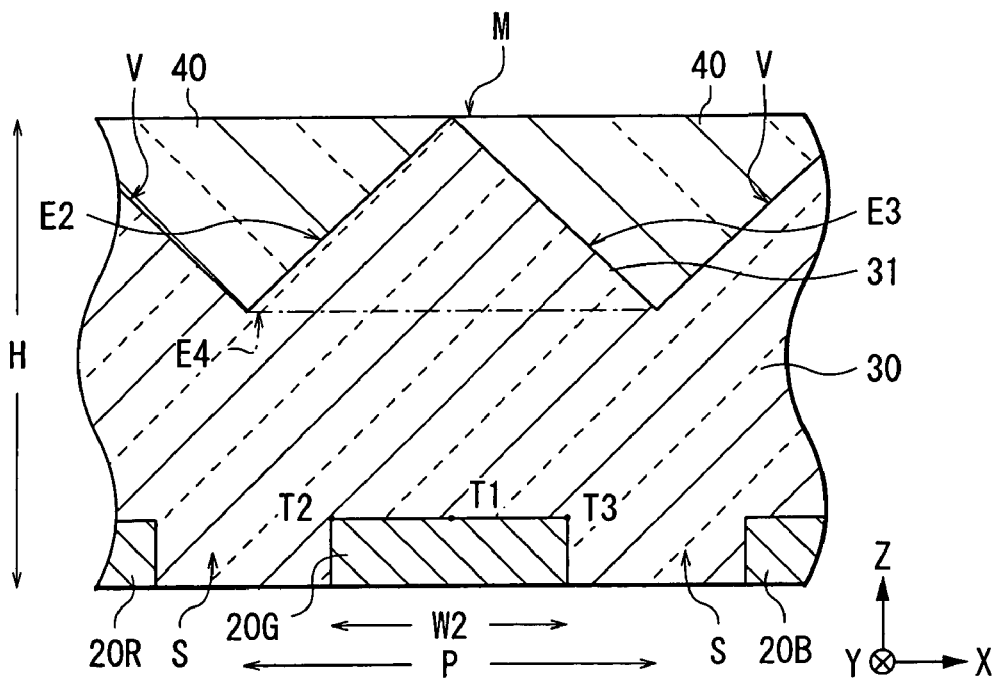
FIG. 8 is a cross sectional view showing a second modification regarding a construction of the micro prism.

Secondly, for example, as shown in FIG. 8, the micro prism 31 can be constructed, so that the micro prism 31 has a triangle cross section including the oblique faces E2 and E3 and the virtual face E4. In this case as well, luminance can be uniformised over the whole facing direction by the action similar to that shown in FIG. 7.

Figure 9:
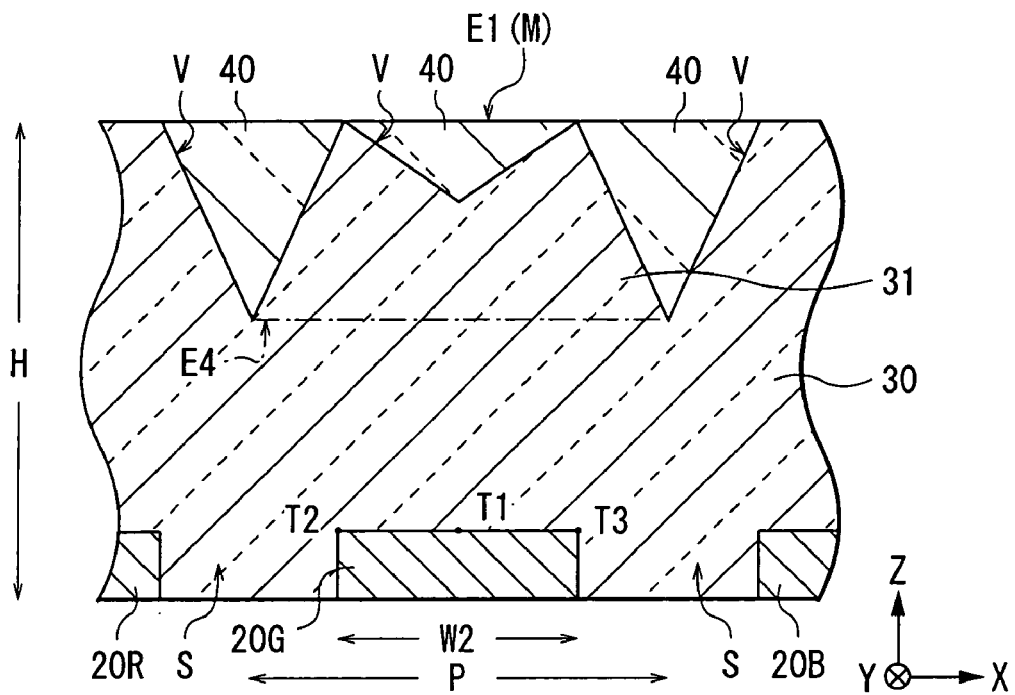
FIG. 9 is a cross sectional view showing a third modification regarding a construction of the micro prism.

Thirdly, for example, as shown in FIG. 9, the micro prism 31 can be constructed, so that the micro prism 31 has a pentagon cross section wherein there are the virtual face E4 and its opposite side face whose top part is fallen, by modifying the micro prism 31 having the trapezoidal cross section shown in FIG. 3 by newly providing a void V with a inverted triangle cross section at the place corresponding to the end face E1, and by newly embedding the auxiliary prism 40 in this void V.

Figure 10:
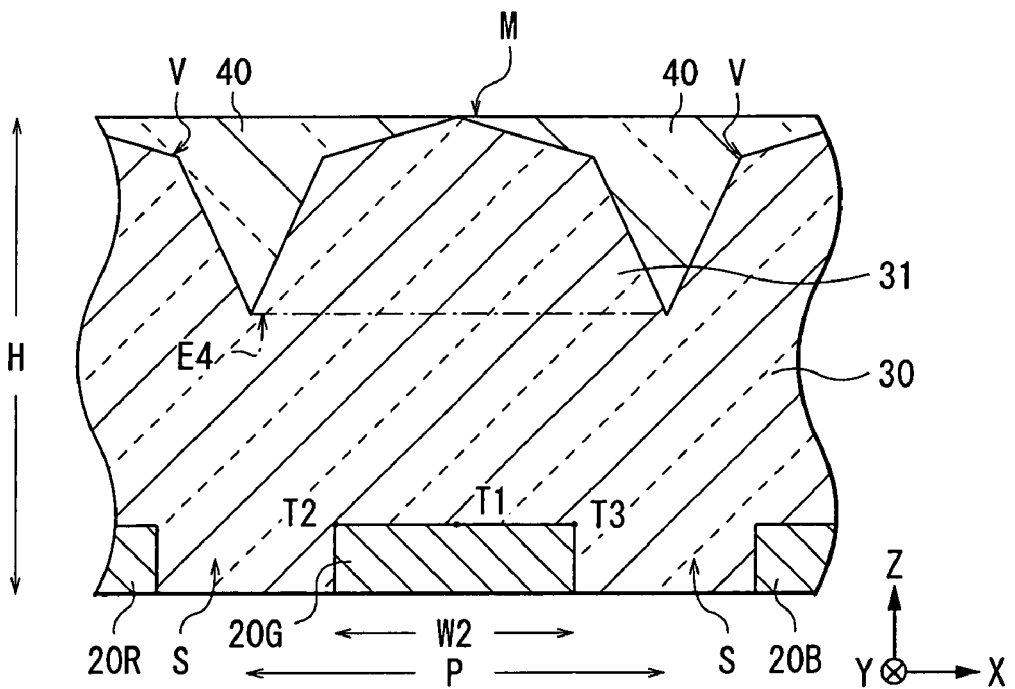
FIG. 10 is a cross sectional view showing a fourth modification regarding a construction of the micro prism.

Fourthly, for example, as shown in FIG. 10, different from the case shown in FIG. 9, the micro prism 31 can be constructed, so that the micro prism 31 has a pentagon cross section wherein there are the virtual face E4 and its opposite side face whose top part is sharp. In the micro prisms 31 having constructions shown in FIGS. 9 and 10, particularly, luminance in the facing direction can be improved.

Figure 11:
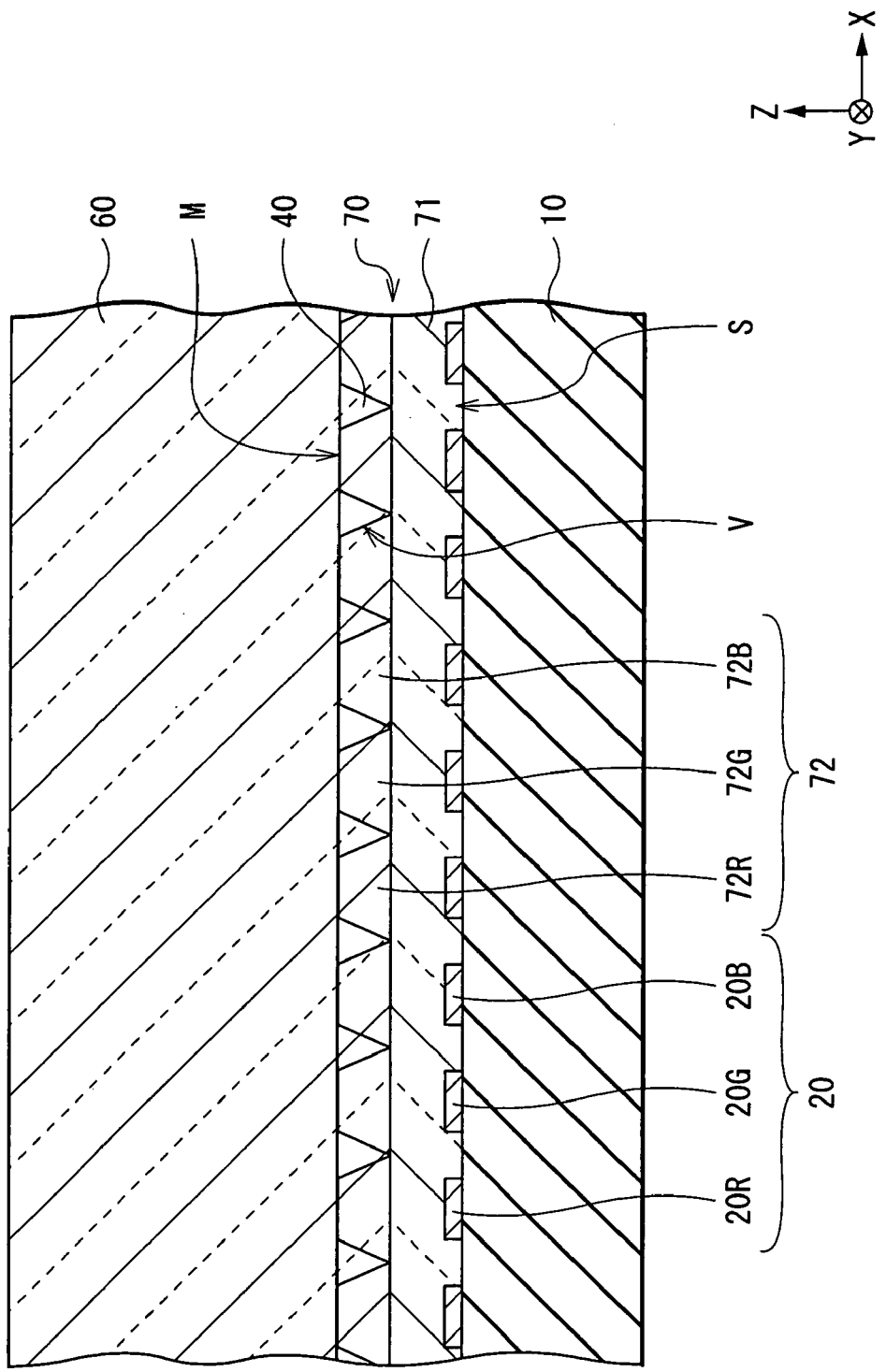
FIG. 11 is a cross sectional view showing a modification regarding a construction of the organic EL display.

Further, in this embodiment, as shown in FIG. 1, the color filters 50 are provided separately from the micro prism sheet 30. However, constructions are not always limited to the above, for example, as shown in FIG. 11, instead of the micro prism sheet 30 (micro prisms 31) and the color filters 50 (50R, 50G, and 50B), a micro prism sheet 70 wherein micro prisms 72 (72R, 72G, and 72B) of three colors corresponding to three primary colors in light are arranged can be provided on a sheet 71. These micro prisms 72R, 72G, and 72B are arranged respectively corresponding to the organic EL devices 20R, 20G, and 20B, and have a function as the color filters 50R, 50G, and 50B in addition to a function as the micro prisms 31. These micro prisms 72R, 72G, and 72B are, for example, made by dispersing respective three colors pigments in the resin material of the micro prisms 31. In this organic EL display, since only the micro prisms 72 can play a role as both the micro prisms 31 and the color filters 50, labor of positioning the color filters 50 in relation to the micro prisms 31 can be omitted, and a construction of the organic EL display can be simplified. The construction of the organic EL display shown in FIG. 11 is similar to that in the foregoing embodiment except for the foregoing feature parts.

Figure 12:
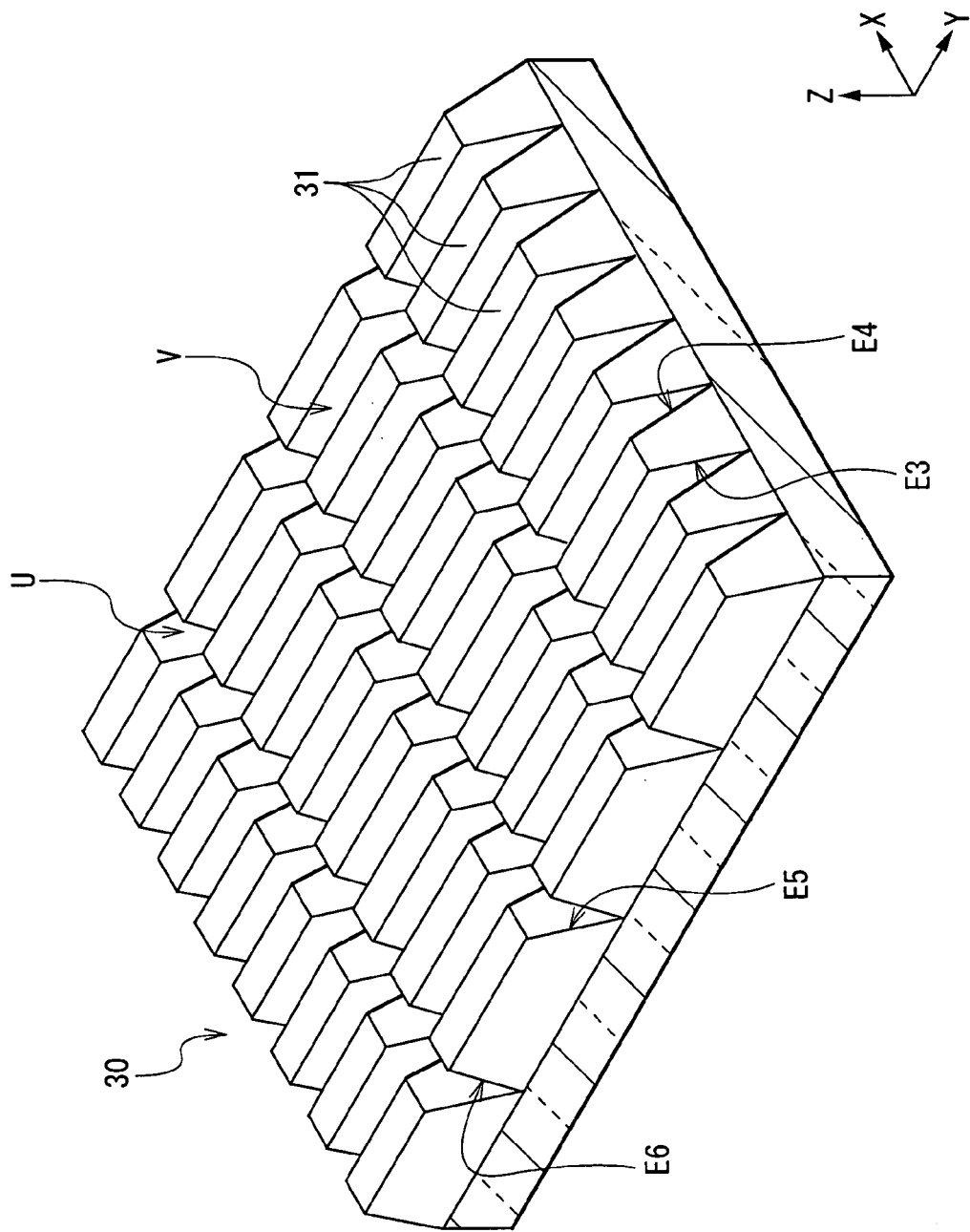
FIG. 12 is an oblique perspective figure showing a modification regarding a construction of the micro prism sheet.

Further, in this embodiment, as shown in FIG. 2, the plurality of micro prisms 31 which are pattern-arranged by sandwiching the voids V continuously extend in the direction of Y-axis. However, constructions are not always limited to the above. For example, as shown in FIG. 12, the micro prism sheet 30 can be constructed to include the plurality of micro prisms 31 in the shape of block formed intermittently, by further providing voids U extending in the direction of X-axis in the plurality of micro prisms 31, and segmentalising respective micro prisms 31 at given intervals using these voids U as boundary. In this case, it is preferable that a cross section along X-Z plane of the micro prism 31 makes a trapezoid including oblique faces E5 and E6 as oblique lines as the cross section along X-Z plane, by slanting opposing faces between respective micro prisms 31 so that these faces depart from each other. In this organic EL display, in the oblique faces E5 and E6, light focus similar to the light focus of the lights L2 and L3 utilizing refraction phenomenon in the oblique faces E3 and E4 (refer to FIG. 3) can be obtained. Therefore, a visual field angle is narrowed not only in the direction of X-axis, but also in the direction of Y-axis. Consequently, taking a look inside of the display screen image can be prevented more effectively.

Further, though in this embodiment, the color filters 50 are included, constructions are not always limited to the above, and it is possible not to include the color filters 50. In this case, a construction of the organic EL display can be simplified. However, as mentioned above, considering advantages based on the color filters 50 such as improvement of color purity, it is preferable to construct the organic EL display which includes the color filters 50.

Figure 13:
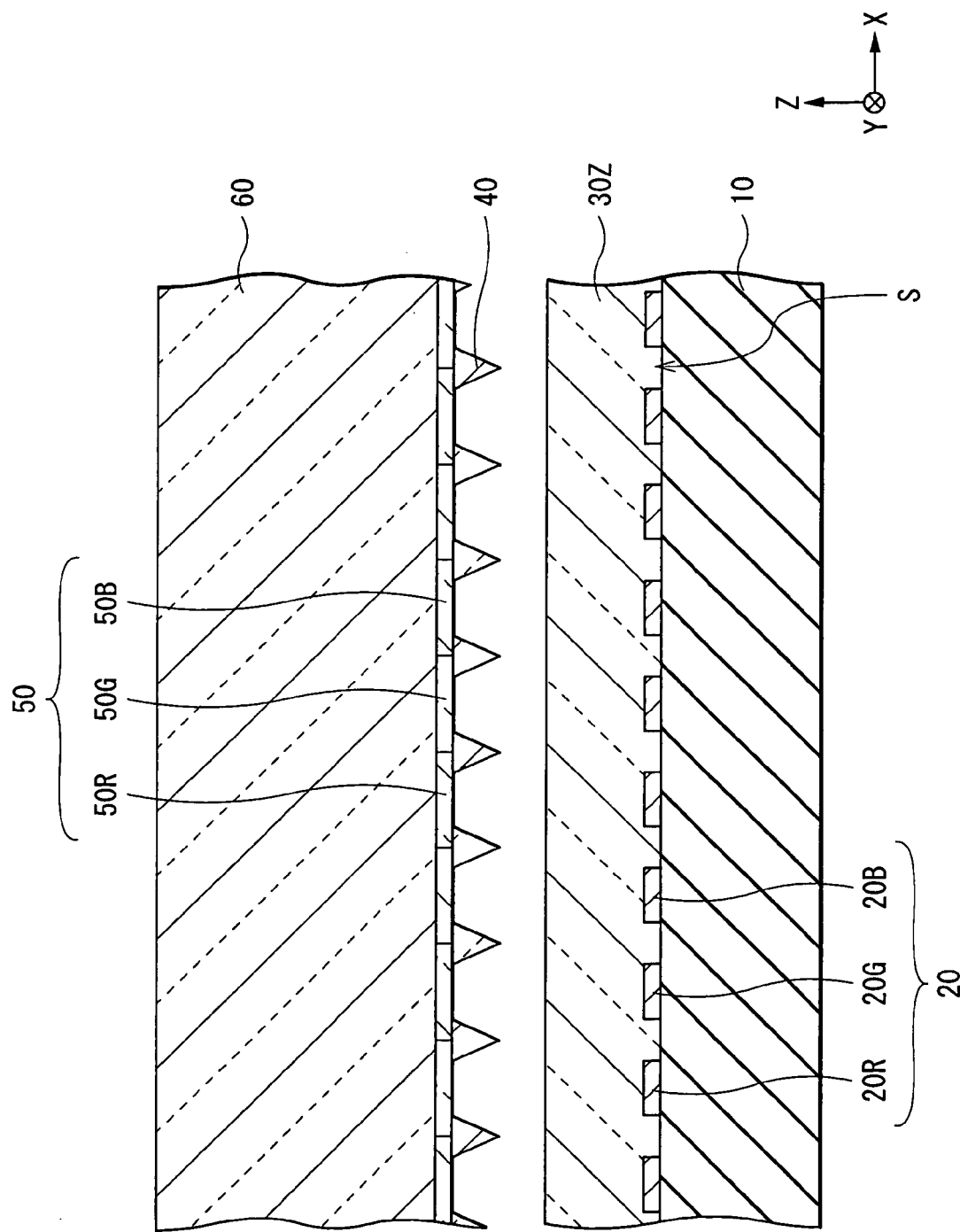
FIG. 13 is a cross sectional view to explain a manufacturing process for the organic EL display according to the embodiment of the invention.
Figure 14:
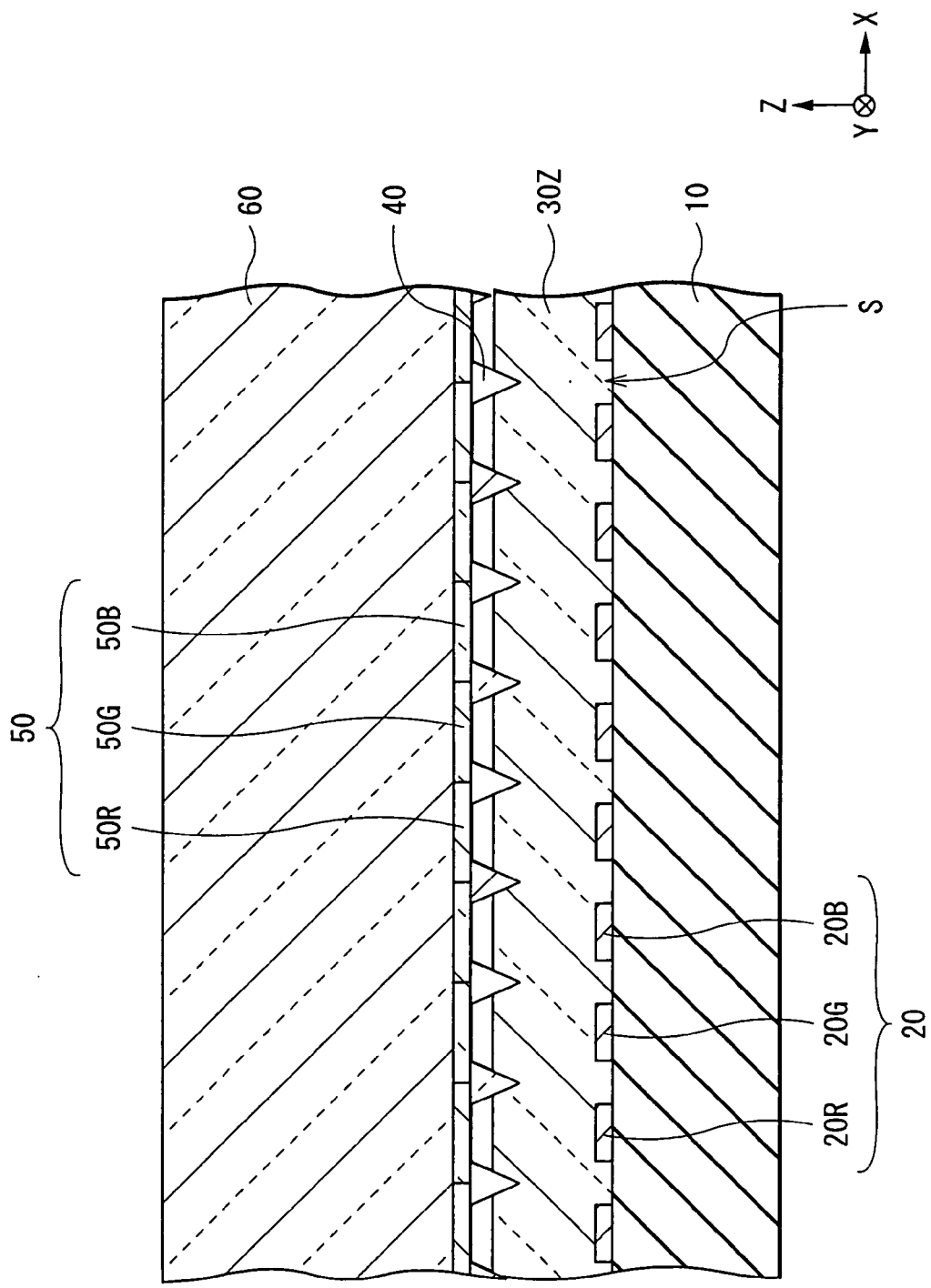
FIG. 14 is a cross sectional view to explain a process following the process showing in FIG. 13.

Next, with reference to FIGS. 1 to 4 and FIGS. 13 and 14, a method of manufacturing the organic EL display according to this embodiment will be described. FIGS. 13 and 14 are intended to explain manufacturing processes of the organic EL display. The following descriptions will be made mainly focusing on the manufacturing processes of the micro prism sheet 30 which is a feature part of the invention.

When manufacturing the organic EL display, first, as shown in FIG. 13, after forming the color filters 50 (50R, 50G, and 50B) on the whole face of the cover plate 60, the plurality of auxiliary prisms 40 whose cross sections along X-Z plane are triangles are pattern-formed on the color filters 50 by using a fluorocarbon resin having a low refraction index characteristic (for example, refraction index $n2=1.40$). As a method to form the auxiliary prisms 40, for example, a method wherein after forming a fluorocarbon resin by using a metal mold corresponding to the shape of the auxiliary prisms 40, the fluorocarbon resin is photo-cured or hot-cured can be cited.

Subsequently, as shown in FIG. 13, after pattern-forming the organic EL devices 20 (20R, 20G, and 20B) on the driving substrate 10 (refer to FIG. 4), a sealing resin layer 30Z (prism precursor layer) is formed by using an epoxy resin with high refraction index characteristics (for example, refraction index $n1=1.59$) and excellent sealing characteristics to cover these organic EL devices 20. This sealing resin layer 30Z is a prearrangement layer to form the micro prism sheet 30, and particularly in this process, also has a function as a sealing adhesive used for bonding the driving substrate and the cover plate 60 to each other and sealing the organic EL devices 20 between the driving substrate 10 and the cover plate 60.

Subsequently, as shown in FIG. 13, after placing the driving substrate and the cover plate 60 opposite so that the sealing resin layer 30Z and the auxiliary prisms 40 are placed opposite to each other, the cover plate 60 is press bonded to the driving substrate 10. With this press bonding process, as shown in FIG. 14, the auxiliary prisms 40 function as metal molds to the sealing resin layer 30Z, and the auxiliary prisms 40 cut into the sealing resin layer 30Z, so that the sealing resin layer 30Z is formed by utilizing the shape of the auxiliary prisms 40. Lastly, after contacting the color filters 50 to the sealing resin layer 30Z, the photo-curing treatment or the hot-curing treatment is performed on the sealing resin layer 30Z as necessary. In result, as shown in FIG. 1, the voids V are formed at the places where the auxiliary prisms 40 cut into the sealing resin layer 30Z, the auxiliary prisms are embedded into these voids V, and the micro prism sheet 30 is formed to include the plurality of micro prisms 31 which are pattern-arranged between each void V (refer to FIG. 2). A cross section along X-Z plane of the micro prism 31 becomes a trapezoid shape (refer to FIG. 3). Consequently, the organic EL display is completed.

In the method of manufacturing the organic EL display according to this embodiment, the micro prism sheet 30 including the plurality of micro prisms 31 is formed by using the pre-formed auxiliary prisms 40 as metal molds to the sealing resin layer 30Z, and forming the sealing resin layer 30Z by press bonding these auxiliary prisms 40. Therefore, physical relationship between the micro prisms 31 and the auxiliary prisms 40 is correctly determined at the time of forming the micro prism sheet 30 by utilizing an easy press bonding process, there is no air gap between the micro prism sheet 30 and the auxiliary prisms 40, and contact of the micro prism sheet 30 and the auxiliary prisms 40 is assured. Consequently, in this embodiment, it is possible to easily manufacture the organic EL display of the invention which can improve the emission efficiency. In addition, in this embodiment, there is no need to separately prepare the mold since the auxiliary prisms 40 are used as metal molds to the sealing resin layer 30Z. Therefore, from this view point as well, contribution to easy manufacturing can be made, and manufacturing cost can be reduced.

Further, in this embodiment, by changing a pressure when press bonding the auxiliary prisms 40 to the sealing resin layer 30Z, the height H (refer to FIG. 3) of the micro prism sheet 30 which is one factor to determine the visual field angle can be adjusted. Namely, the larger the pressure in press bonding is, the smaller the height H is; and the smaller the pressure is, the larger the height H is.

In this embodiment, the organic EL display is manufactured by press bonding the cover plate 60 wherein the auxiliary prisms 40 are formed to the driving substrate 10 wherein the sealing resin layer 30Z is formed. However, constructions are not always limited to the above, for example, the organic EL display can be manufactured by the following procedures.

Figure 15:
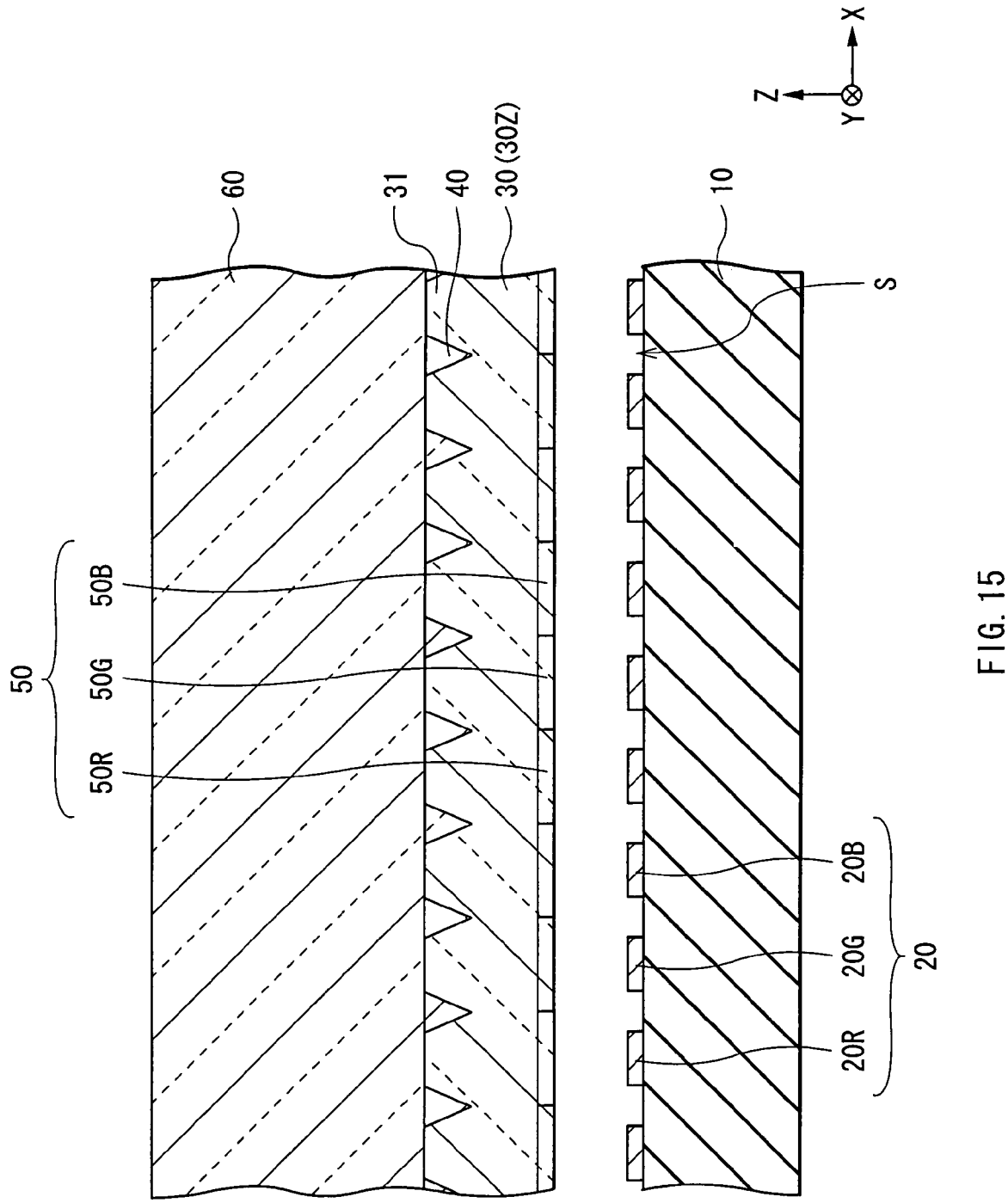
FIG. 15 is a cross sectional view to explain a modification regarding a method of manufacturing the organic EL display.
Figure 16:
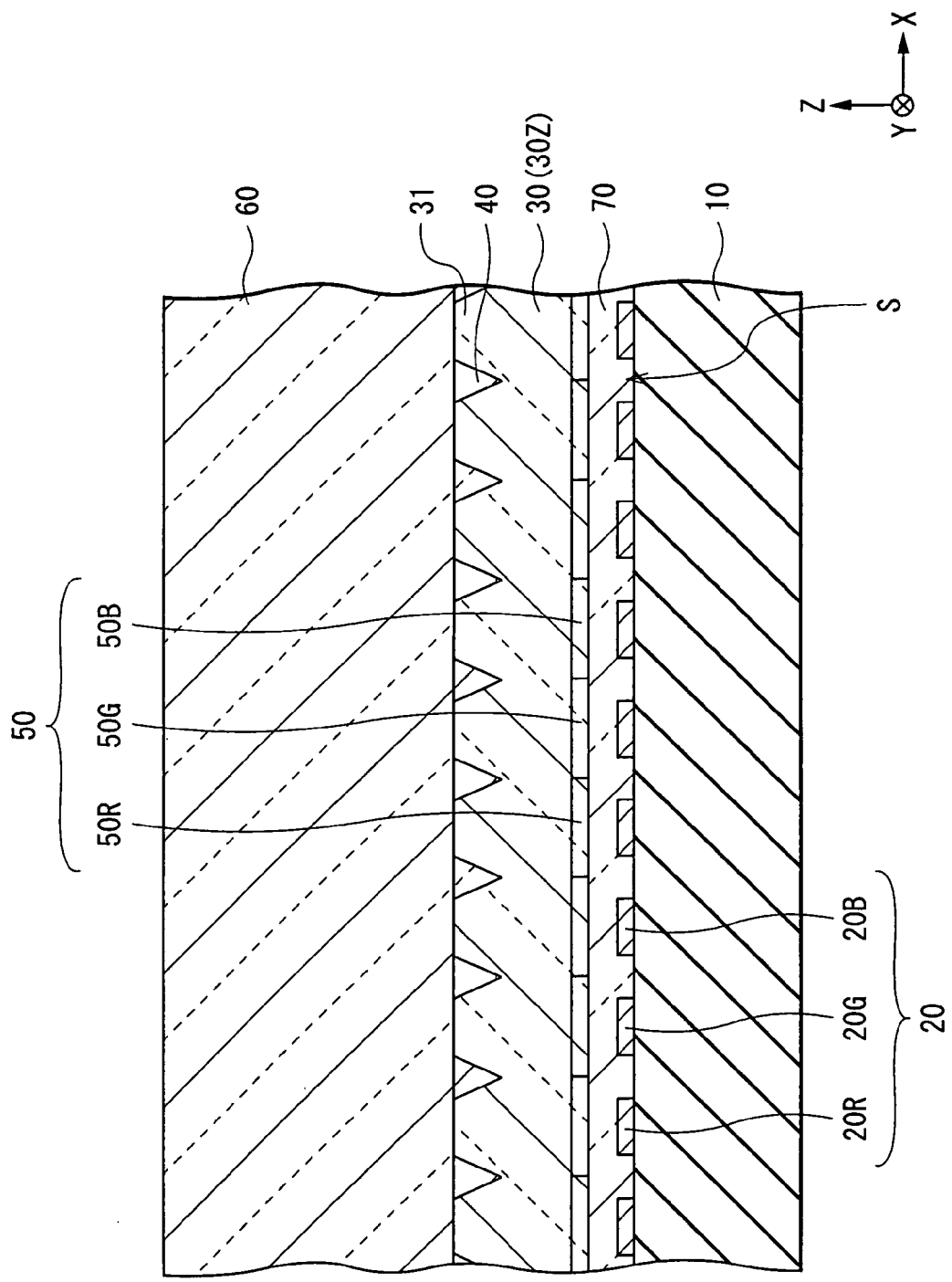
FIG. 16 is a cross sectional view to explain a process following the process showing in FIG. 15.

Namely, first, as shown in FIG. 15, the organic EL devices 20 (20R, 20G, and 20B) are pattern-formed on the driving substrate 10. Subsequently, by forming the auxiliary prisms 40 on the cover plate 60, and forming the sealing resin layer 30Z to cover these auxiliary prisms 40 and have a flat surface, the micro prism sheet 30 including the micro prisms 31 is formed with forming action as in the foregoing embodiment. After that, on the flat face of the micro prism sheet 30, the color filters 50 (50R, 50G, and 50B) are formed by using, for example, a printing technique with high-precision positioning or photolithography treatment. Then, for example, it is possible to further form a black mask on the color filters 50. Lastly, as shown in FIG. 16, by bonding the driving substrate 10 and the cover plate 60 with a sealing resin layer 70 in between, and sealing the organic EL devices 20 in the sealing resin layer 70, the organic EL display is completed. As a material to form the sealing resin layer 70, for example, it is preferable to use a material which has a high refraction index characteristic (for example, refraction index $n3=n1=1.59$) as in the sealing resin layer 30Z. According to this technique, particularly, differing from the case in the foregoing embodiment, in manufacturing aspect, mixing air bubbles in covering the organic EL devices 20 by the sealing resin layer 30Z can be prevented, and in the performance aspect, arrangement positions of the color filters 50 become close to the arrangement positions of the organic EL devices 20, so that a visual field angle can be intentionally set to wider. This technique is useful, for example when it is desired not to narrow the visual field angle more than required, along with preventing third persons from taking a look inside of the display screen image from the directions other than the facing direction.

Figure 17:
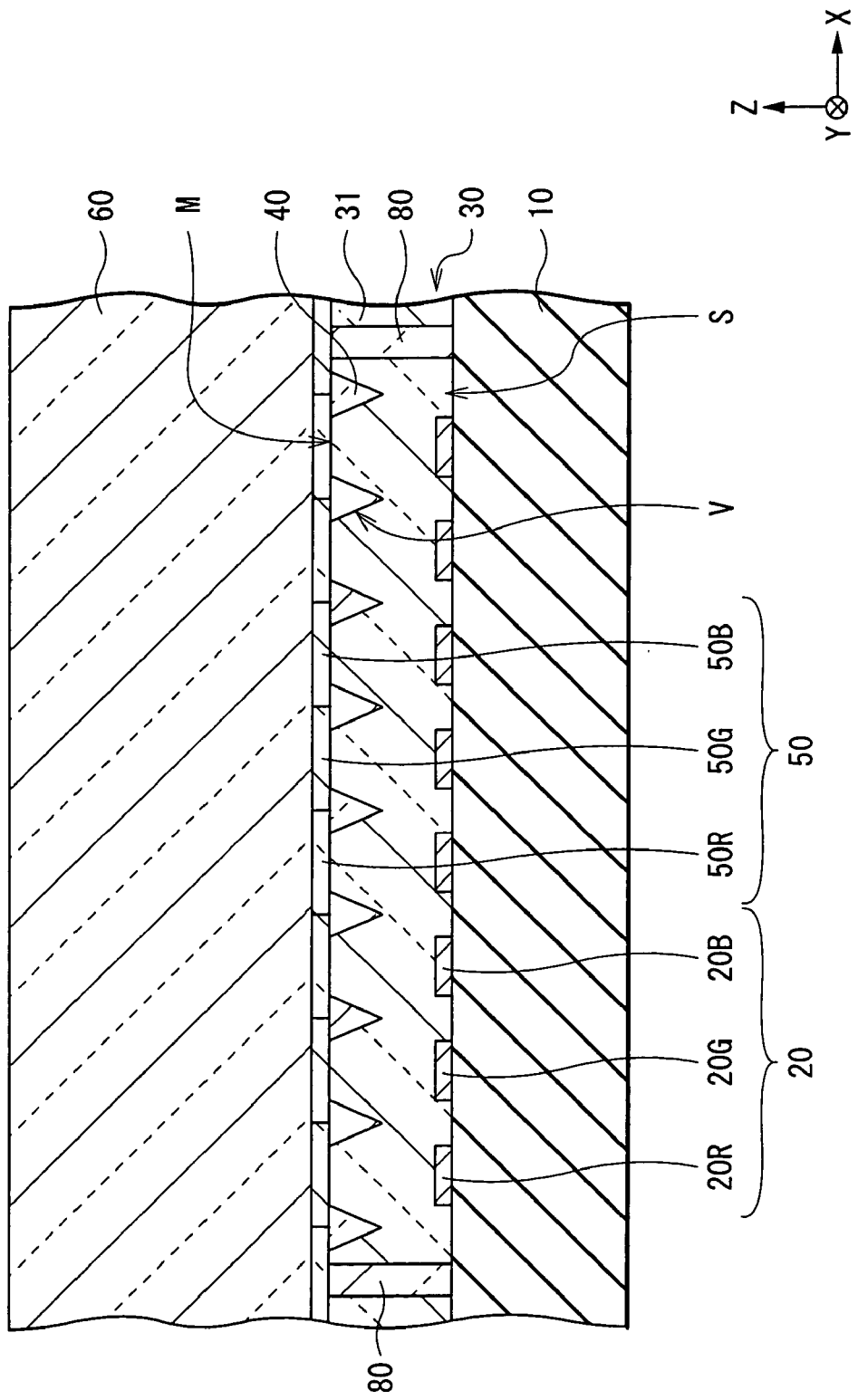
FIG. 17 is a cross sectional view to explain a modification regarding a method of manufacturing the organic EL display.

Further, in this embodiment, for example, in order to control a height H of the micro prism sheet 30 which is finally formed when press bonding the auxiliary prisms 40 to the sealing resin layer 30Z, so that the height H becomes the targeted value, it is possible, as shown in FIG. 17, to provide a plurality of (e.g. two) spacers 80 in the micro prism sheet 30, and determine the height H based on a height of this spacer 80. Materials for this spacer 80 include, for example, a resin having a refraction index nearly equal to that of the micro prism sheet 30, more specifically, epoxy resin, polycarbonate, polystyrene and the like. Shapes of this spacer 80 include, for example, pole and rod. For providing the spacers 80 in the micro prism sheet 30, for example, it is possible to form the spacers 80 as well as the auxiliary prisms 40 when forming the auxiliary prisms 40 on the cover plate 60, and it is also possible to embed the spacers 80 in the sealing resin layer 30Z before press bonding after forming the sealing resin layer 30Z. As arrangement positions for the spacers 80, for example, positions on the periphery of the organic EL devices 20, namely, positions which have no relation to light emitting, and wherein the cover plate 60 can be steadily supported at a given space from the driving substrate 10 are preferable. Since by utilizing the spacers 80, in press bonding, a space between the driving substrate 10 and the color filters 50 is determined by a height of the spacers 80, it is possible to correctly define a height H of the micro prism sheet 30 based on the height of the spacers 80.

Further, in this embodiment, in the case where the organic EL display is designed not to include the color filters 50, the auxiliary prisms 40 and the cover plate 60 can be integrally formed.

While the invention has been described with reference to the embodiment, the invention is not limited to the foregoing embodiment, and various modifications may be made. For example, though in the foregoing embodiment, the case applying the invention to the organic EL display which displays images by utilizing organic EL phenomenon has been described, application of the invention is not limited to the foregoing case, and the invention can be applied to self light emitting displays other than the organic EL display.

As described above, according to the display unit of the invention, the plurality of first prisms which are arranged corresponding to the plurality of light emitting devices, and refract the lights for image display, and the second prisms, which are at least embedded in the voids formed between the first prisms and have a smaller refraction index than that of the first prisms are provided. Therefore, a light volume of the lights for image display viewed in the direction facing the organic EL display (facing direction) becomes a total of a light volume of lights essentially emitted from the light emitting devices in the facing direction, and a light volume of lights, which are directed in the facing direction by utilizing refraction phenomenon based on differences of refraction index between the first prism and the second prism. Consequently, compared to the case wherein the first prisms and the second prisms are not provided, an emission volume is increased by the light volumes directed in the facing direction, so that emission efficiency of the light for image display in the facing direction is improved, and luminance of the display image can be assured.

According to the method of manufacturing the display unit of the invention, the plurality of first prisms are formed by press bonding the second prisms to the prism precursor layer and forming the prism precursor layer by utilizing the shape of the second prisms. Therefore, physical relationship between the first prisms and the second prisms is correctly determined at the time of forming the first prisms by utilizing an easy press bonding process, there is no air gap between the first prisms and the second prisms, and contact of the first prisms and the second prisms is assured. Consequently, it is possible to easily manufacture the display unit of the invention which can improve the emission efficiency. In addition, there is no need to separately prepare the mold since the second prisms are used as metal molds to the prism precursor layer. Therefore, manufacturing cost can be reduced.

According to the display unit of one aspect of the invention, the optical filters which are arranged corresponding to each light emitting device, and which selectively transmit the lights for image display are provided. Therefore, by utilizing the selective light transmittance characteristic of these optical filters, while an emission volume of the lights emitted in the facing direction is assured, an emission volume of the lights emitted in the directions other than the facing direction is decreased. Consequently, display images can be clearly viewed in the facing direction, and the display images become hard to be viewed in the directions other than the facing direction, so that it becomes possible to intentionally limit a visual field angle, and prevent third persons from taking a look inside of the display image from the directions other than the facing direction.

According to the display unit of another aspect of the invention, since the light emitting devices have an optical resonator structure, reflectance near the light emitting wave length of the light emitting device is selectively lowered. Therefore, color purity of the light for image display can be improved.

Obviously many modifications and variations of the present invention are possible in the light of the above teachings. It is therefore to be understood that within the scope of the appended claims the invention may be practiced otherwise than as specifically described.

What is claimed is:

1. A display unit, comprising:
   a plurality of light emitting devices;
   a plurality of first prisms which are arranged such that each first prism corresponds to at least one light emitting device; and
   a plurality of second prisms wherein each second prism is at least in part embedded in a void formed between two of the first prisms, and wherein the second prisms have a smaller refraction index than that of the first prisms;
   wherein light generated by the light emitting devices is extracted outside of the display unit in a direction from the light emitting devices toward the first and second prisms.

2. A display unit according to claim 1, wherein:
   nonluminescent spaces are provided between each light emitting device; and
   each of the first prisms has an end face which is positioned corresponding to the light emitting device and two oblique faces which are positioned respectively corresponding to adjacent two nonluminescent spaces, and has a trapezoidal cross section wherein the end face is an upper base and the two oblique faces are oblique lines.

3. A display unit according to claim 1, further comprising optical filters which are arranged corresponding to each light emitting device, and which selectively transmit the lights for image display.

4. A display unit according to claim 1, wherein the first prisms include pigments whose colors correspond to the lights for image display, and have a function to selectively transmit the lights for image display.

5. A display unit according to claim 1, further comprising:
a support substrate to support the light emitting devices; and
a transparent substrate which is arranged on the opposite side of the light emitting devices sandwiching the first and the second prisms, and which constructs emission paths to emit the lights for image display outside, wherein
the first prisms have a function to bond the support substrate and the transparent substrate together, and a function to seal the light emitting devices between the support substrate and the transparent substrate.

6. A display unit according to claim 1, wherein the first prisms are made of a resin which has a water vapor permeability of 50 g/m$^2 \cdot$24 hours or less.

7. A display unit according to claim 1, wherein the light emitting devices generate the lights for image display by utilizing organic light emitting phenomenon.

8. A display unit according to claim 7, wherein the light emitting device includes a light emitting layer which generates the lights for image display and two electrode layers sandwiching the light emitting layer, and has a resonator structure which makes the lights for image display generated in the light emitting layer resonate between the two electrode layers.

9. A method of manufacturing a display unit, including the steps of:
forming a prism precursor layer to form a plurality of first prisms to cover a plurality of light emitting devices which are pattern-arranged on a support substrate;
pattern-forming a plurality of second prisms on a transparent substrate; and
forming the first prisms by placing the support substrate and the transparent substrate opposite so that the prism precursor layer and the second prisms are placed opposite to each other, and then pressure bonding the transparent substrate to the support substrate, and forming the first prisms in the prism precursor layer by utilizing a shape of the second prisms.

* * * * *